United States Patent

Chabbert et al.

[11] Patent Number: 5,587,660
[45] Date of Patent: Dec. 24, 1996

[54] PROCESS FOR EVALUATING THE REMAINING CHARGE IN AN ACCUMULATOR BATTERY

[75] Inventors: Philippe Chabbert, Rueil Malmaison; Alain Chatenay, Marly le Roi; Dominique Meux, Toulouse, all of France

[73] Assignee: Thomson-CSF, Paris, France

[21] Appl. No.: 411,697

[22] PCT Filed: Jul. 26, 1994

[86] PCT No.: PCT/FR94/00934

§ 371 Date: Apr. 6, 1995

§ 102(e) Date: Apr. 6, 1995

[87] PCT Pub. No.: WO95/04938

PCT Pub. Date: Feb. 16, 1995

[30] Foreign Application Priority Data

Aug. 6, 1993 [FR] France ................................ 93 09713

[51] Int. Cl.$^6$ ................................................ G01N 27/42
[52] U.S. Cl. ................................ 324/426; 324/431
[58] Field of Search ........................ 324/426, 427, 324/431, 435, 428

[56] References Cited

U.S. PATENT DOCUMENTS

| | | | |
|---|---|---|---|
| 4,377,787 | 3/1983 | Kikuoka et al. | 324/426 |
| 4,952,862 | 8/1990 | Biagetti et al. | 324/427 |
| 5,130,659 | 7/1992 | Sloan | 324/426 |
| 5,349,540 | 9/1994 | Birkle et al. | 324/427 |

*Primary Examiner*—Louis M. Arana
*Attorney, Agent, or Firm*—Oblon, Spivak, McClelland, Maier & Neustadt, P.C.

[57] ABSTRACT

A process is disclosed for evaluating the remaining charge in an accumulator battery by determining the residual charge at the start of discharge, adding up the quantities of energy extracted as and when the battery is used, determining the quantities of charge which are not restorable instantaneously because of a high discharge rate, charge which is restorable by relaxation of the battery and charge which is not restorable under the influence of temperature.

4 Claims, 3 Drawing Sheets

PROCESS FOR EVALUATING THE REMAINING CHARGE IN AN ACCUMULATOR BATTERY

The present invention relates to a process for evaluating the remaining charge in an accumulator battery.

A self-contained electric traction vehicle cannot be used in an urban area unless the remaining endurance which its traction accumulator batteries can confer upon it is known as accurately as possible. The remaining endurance of the vehicle corresponds to the distance or time for which the car can run before exhausting the electric charge contained in these traction accumulator batteries. A knowledge of the remaining self-containment of the vehicle relies on a knowledge of two factors. The first of these factors, which is subjective, concerns the consumption of the vehicle over the trips ahead. This consumption depends in particular on the profile of the journey, on the density of traffic and on the driver's way of driving. The second factor, which is objective, concerns the charge restorable at each instant by the traction battery.

The existing devices which indicate the restorable charge, and which are called gauges, are based on measurement of the voltage across the terminals of the battery (Curtis type devices, etc.). The accuracy of these devices is less than 20% of the nominal capacity for a new battery, and deteriorates considerably on aging: the error of estimation can exceed 50%.

The subject of the present invention is a process for evaluating the remaining charge in an accumulator battery, which makes it possible to evaluate the remaining charge with the best possible accuracy, regardless of the conditions of use of the battery and regardless of its age.

The process according to the invention, for evaluating the remaining charge in an accumulator battery, according to which the residual charge at the start of discharge is determined and the quantities of electricity extracted as and when the battery is used are added up, is characterized in that account is taken of the quantities of charge which are not restorable instantaneously under the influence of the discharge rate and of the charge which is restorable by reducing the intensity of the current drawn from the battery.

The present invention will be better understood on reading the detailed description of an embodiment taken as non-limiting example and illustrated by the appended drawing in which.

Figure 1:
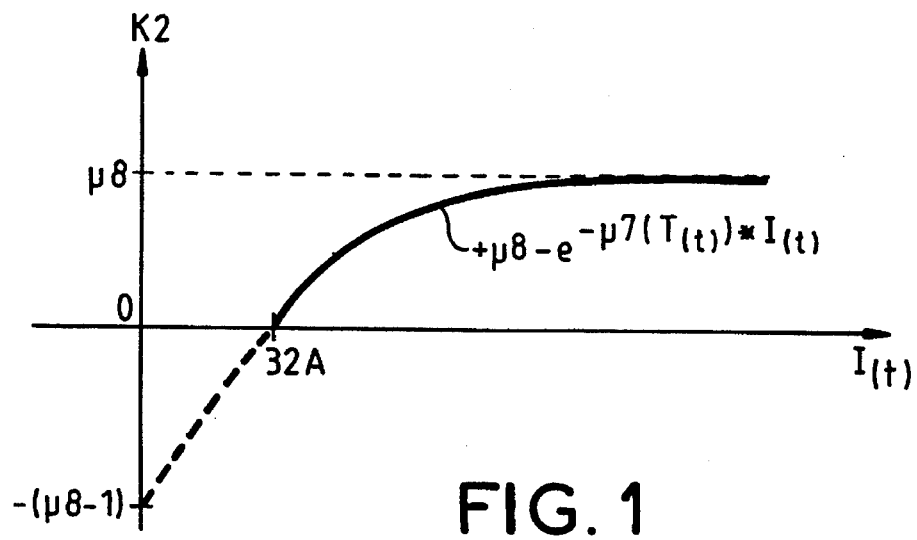
FIG. 1 is a graph of the restorable charge of a battery, as a function of temperature.
Figure 2:
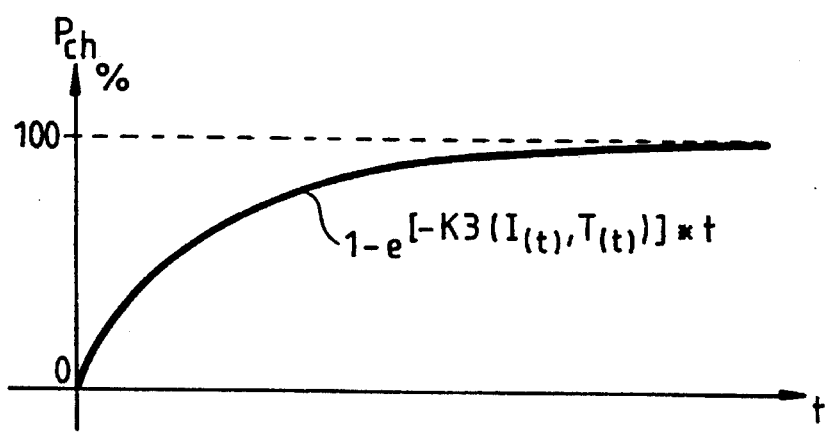
FIG. 2 is a graph of the restoring of the charge which is not restorable instantaneously of a battery as a function of time.

The invention is described below with reference to a traction accumulator battery for electric vehicle, but obviously it is not limited to such a type of accumulator and may be implemented for various types of accumulator, from the simple accumulator for small portable apparatus up to a large back-up accumulator set for stationary plant of high power. These accumulators can be of various technologies: lead, cadmium-nickel, etc. For simplicity, in the remainder of the text, the term battery will be used to designate any one of these accumulators or sets of accumulators.

The operating modes envisaged for the battery are as follows: discharge, charging when stationary, charge recovery by braking (valid only for the application to vehicles with energy recovery from braking or deceleration), and self-discharge during storage without use. To each of these modes of operation of the battery there corresponds a determination of the charge restorable by the battery, described below.

Mode of operation in the discharge regime:

Calculation of the charge remaining in a battery during the discharge phase amounts to calculating, for a set of consecutive time spans $\Delta t$, the value $Ch_{(t)}$ whose mathematical expression (1) is given a little later on.

In the expression (1), $Ch_{(ti)}$ denotes the initial charge contained in the battery at the start of the discharge phase, $I_{(t)}$ denotes the current provided by the battery and measured at each instant $\Delta t$, $Ch_{(t)}$ denotes the charge contained in the battery at each instant, and $T_{(t)}$ denotes the temperature of the battery, measured at each instant.

Calculation of $Ch_{(t)}$ depends on five terms which are related to the physico-chemical behaviour of the battery. These terms are:

1) the residual charge at the start of discharge;
2) the quantity of electricity consumed, measured in series with the battery (measurement of the current provided by the battery throughout the entire time of use);
3) the portion of the charge of the battery which is not restorable under the influence of temperature;
4) the portion of the charge which is not restorable under the influence of the battery discharge rate;
5) the portion of the charge restored through the relaxation of the battery.

Of these five terms, the first two are used by the known processes, whereas the other three are specific to the process of the invention.

First term: residual charge at the start of discharge=$Ch_{(t-\Delta t)}$: this is the value of the charge available in the battery and calculated at the calculation step $\Delta t$ preceding the relevant instant t. At the start of the discharge phase it is equal to $Ch_{(ti)}$.

Second term: quantity of electricity consumed measured for a battery:

$$-I_{(t)} * \Delta t$$

this is the quantity of electricity extracted from the battery during the calculation step $\Delta t$.

Third term: portion of the charge not restorable under the influence of temperature:

$$f1(Ch_{(t)}, T_{(t)}):$$

this is the function characterizing the charge which the battery cannot restore owing to the ambient temperature. Mathematically it represents the fact that at low temperature the phenomena of diffusion of charges within the electrolyte are slowed down and render charges inaccessible during discharge.

It is expressed in the general form:

$$F1(Ch_{(t)}T_{(t)})=K_1(T_{(t)})/100*Ch_{(t)}$$

for example, for a sealed lead traction battery: a formula is used of the form (approximation by linear segments—see FIG. 1):

for $T_{(t)} \leq 30°$ C.: $K_1(T_{(t)})=\mu 1*T_{(t)}+\mu 2$ for $10°$ C.$\leq T_{(t)} \leq 30°$ C.: $K_1(T_{(t)})=\mu 3*T_{(t)}+\mu 4$ for $+10°C. \leq T_{(t)}$: $K_1(T_{(t)}=\mu5*T_{(t)}+\mu6$ Fourth term: portion of the charge not restorable under the influence of the discharge rate:

$$-f2[Ch_{(t)}, T_{(t)}, I_{(t)}]*\Delta t$$

This is a function characterizing the instantaneous efficiency (K2) of discharge, that is to say the instantaneous charge (during the increment of time $\Delta t$) which the battery cannot restore owing to the current demanded by the consumer connected up to the battery (for example: a traction engine). Mathematically it represents the battery "stress" that is to say the fact that at high current the phenomena of diffusion of charges within the electrolyte are not fast enough to bring close to the electrodes charges capable of continuing to supply the consumer circuit. These charges which are not immediately available are present in the battery and will become available during periods of relaxation of the battery.

It is expressed in the general form:

$$f2(Ch_{(t)}, T_{(t)}, I_{(t)})=[I_{(t)}*100/\{100-K_2(T_{(t)}, I_{(t)}, Ch_{(t)})\}]-I_{(t)} \quad (A)$$

for example, for a sealed lead traction battery, use is made of a piecewise linearization of a formula of the form:

for $I_{(t)} \leq 32A$ we have $K_2(I_{(t)}, T_{(t)}, Ch_{(t)})=0$ for $-10°C. \leq T_{(t)} \leq 50°C.$ et $32A \leq I_{(t)} \leq 300 A$:

$$K_2(T_{(t)}, I_{(t)})=+\mu8-e^{-\mu7(T_{(t)})}*I^{(t)} \quad (B)$$

Figure 3:
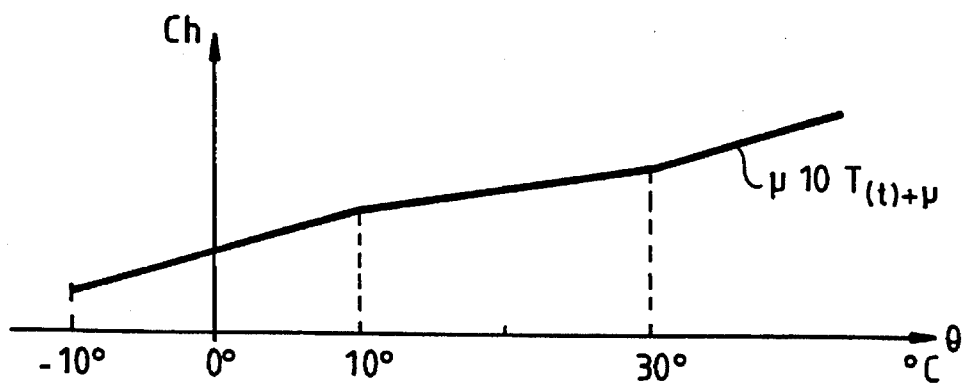
FIG. 3 is a graph of the changes in a coefficient involved in the formula giving the portion of the charge of a battery which is not restorable under the influence of the discharge rate, as a function of discharge current.

(see FIG. 3).

Fifth term: portion of the charge restored by relaxation of the battery: (no usage of the battery or sharp reduction in the discharge current)

$$+f3[-f2(Ch_{(t-\Delta t)}, T_{(t-\Delta t)}, I_{(t-\Delta t)})+Chre\ cov_{(t)}, T_{(t)}, I_{(t)}]*\Delta t \text{ and}$$

$$Chre\ cov_{(t)}=f3[-f2(Ch_{(t-2\Delta t)}, T_{(t-2\Delta t)}, I_{(t-2\Delta t)}+Chre\ cov_{(t-\Delta t)}, T_{(t-\Delta t)}, I_{(t-\Delta t)}]$$

This is a function characterizing the relaxation of the battery during discharge, that is to say the instantaneous charge recovered during the increment of time $\Delta t$ and which could not be restored during the preceding calculation steps ($\Delta t$) owing to the stress of the battery. Mathematically it represents the battery "relaxation", that is to say the fact that the phenomena of diffusion of charges within the electrolyte make it possible progressively to bring charges which were not previously restored close to the electrodes so as to supply the consumer circuit. This charge converges to 0 with time.

It is expressed in the general form:

$$F3[-f2(Ch_{(t-\Delta t)}, T_{(t-\Delta t)}, I_{(t-\Delta t)})+Chre\ cov_{(t)}, T_{(t)}, I_{(t)}]=1-e^{-\{K3\{T(t),\ I(t)\}\}*[-f2(Ch(t-\Delta t),\ T^{(t-\Delta t)},\ I^{(t-\Delta t)})+Chre\ cov^{(t)}]} \quad (C)$$

with:

$$Chre\ cov_{(t)}=f3[-f2\{Ch_{(t-2\Delta t)}, T_{(t-2\Delta t)}, I_{(t-2\Delta t)}\}+Chre\ cov_{(t-\Delta t)}, T_{(t-\Delta t)}, I_{(t-\Delta t)}]$$

for example, for a sealed lead traction battery use is made of a piecewise linearization of a formula of the form:

for $-10°\leq T_{(t)} \leq 50°C.$ et $0A \leq I_{(t)} \leq 300 A$:

$$f3[-f2(Ch_{(t-\Delta t)}, T_{(t-\Delta t)}, I_{(t-\Delta t)})+Chre\ cov_{(t)}, T_{(t)}, I_{(t)}]$$

in this expression, f2 has the value given by the relation (A), K2 has the value given by the relation (B) and f3 has the value given by the relation (C).

Mathematical form for evaluating the charge available in the battery at the instant t: $Ch_{(t)}$.

Let $Ch_{(ti)}$ be the initial charge contained in the battery at the start of the discharge phase.

Let $I_{(t)}$ be the current delivered by the battery and measured at each instant.

Let $Ch_{(t)}$ be the charge contained in the battery at each instant.

Let $T_{(t)}$ be the battery temperature measured at each instant.

Calculation of $Ch_{(t)}$ is carried out according to the formula:

$$Ch_{(t)} = Ch_{(ti)} - f1(CH_{(t)}, T_{(t)}) - \int_{ti}^{t} I_{(t)}\, dt -$$

$$\int_{ti}^{t} f2(Ch_{(t)}, T_{(t)}, I_{(t)})dt + \int_{ti}^{t} f3 \left\{ Ch_{(t)}, T_{(t)}, \int_{ti}^{t-dt} f3 \left( Ch_{(t)}, \right. \right.$$

$$\left. \left. T_{(t)}, \int_{ti}^{t-2dt} f3 \left( Ch_{(t)}, T_{(t)}, \int_{ti}^{t-3dt} \ldots \right) dt \right) dt \right\} dt$$

This formula is expressed in discrete form as follows:

let $\Delta t$ be the period of calculation of the evaluation of $Ch_{(t)}$:

at t=t0: $Ch_{(t)}=Ch_{(ti)}-f1(Ch_{(ti)}, T_{(t0)})$ at t=t0+$\Delta t$ we have:

$$Ch_{(t)}=Ch_{(t0)}-f1(Ch_{(t0)}, T_{(t0)}))-I_{(t)}*\Delta t-f2(Ch_{(t)}, T_{(t)}, I_{(t)}*\Delta t$$

at t=t0+2$\Delta t$ we have:

$$Ch_{(t)}=Ch_{(t-\Delta t)}-f1(Ch_{(t-\Delta t)}, T_{(t-\Delta t)}))-I_{(t)}*\Delta t-f2(Ch_{(t)}, T_{(t)}, I_{(t)})*\Delta t +f3[-f2\{Ch_{(t-\Delta t)}, T_{(t-\Delta t)}, I_{(t-\Delta t)}\}, +Chre\ cov_{(t)}, T_{(t)}, I_{(t)}]*\Delta t$$

Let us call $$Chre\ cov_{(t)}=f3[-f2\{Ch_{(t-\Delta t)}, T_{(t-\Delta t)}, I_{(t-\Delta t)}\}+Chre\ cov_{(t-\Delta t)}, T_{(t)}, I_{(t)})]$$

at t=t0+3$\Delta t$ we have:

$$Ch_{(t)}=Ch_{(t-\Delta t)}-f1[Ch_{t-\Delta t}, T_{(t)}]-I_{(t)}*\Delta t-f2(Ch_{(t)}, T_{(t)}, I_{(t)}))*\Delta t+f3[-f2\{Ch_{t-\Delta t}, T_{(t-\Delta t)}, I_{(t-\Delta t)}\}-Chre\ cov_{(t)}, T_{(t)}, I_{(t)}]*\Delta t$$

at t=t0+n$\Delta t$ we have:

$$Ch_{t0+n\Delta t}=Ch_{(t-\Delta t)}-f1(Ch_{(t-\Delta t)}, T_{(t)}))-I_{(t)}*\Delta t-f2*Ch_{(t)}, T_{(t)}, I_{(t)})*\Delta t$$

$$+f3[-f2\{Ch_{t-\Delta t}, T_{(t-\Delta t)}, I_{(t-\Delta t)}\}+Chre\ cov_{(t)}, T_{(t)}, I_{(t)}]*\Delta t$$

Method for constructing the elements of the previous formula:

A) Expression: $Ch_{(t-\Delta t)}$:

this value is either obtained at the previous calculation step during the discharge mode, or arises out of the calculations for evaluating the charge during the other modes of operation of the battery.

Figure 4:
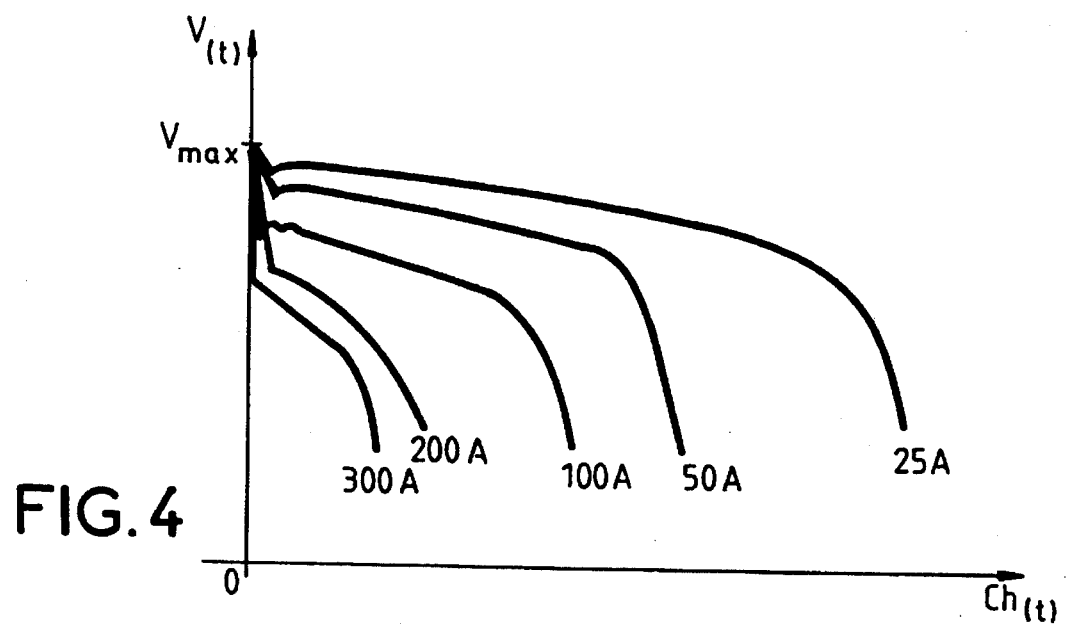
FIGS. 4 to 8 are examples of curves used by the process of the invention.

B) Expression: $f(Ch_{(t)}, T_{(t)})$:

$f(Ch_{(t)}, T_{(t)})$ is obtained by experimentally plotting the following sets of curves:

1$^{st}$) $V_{(t)}=g(Ch_{(t)}, T_{(t)})$. To establish these curves, the parameters are measured with a constant temperature throughout discharge and a rate which is constant over time and is less than or equal to the nominal discharge rate for the type of battery considered (for example $I_5$) with: $V_{(t)}=$ voltage across the terminals of the battery, $T_{(t)}$=battery temperature measured for example on one of the output electrodes and $I_5$=discharge current for complete discharge in five hours. Measurement is repeated for various temperatures. An example of such a set of curves is depicted in FIG. 4 for various constant discharge currents ranging from 300 A to 25 A, the numerical values being mentioned purely as indication, as is the case for all the following figures.

Figure 5:
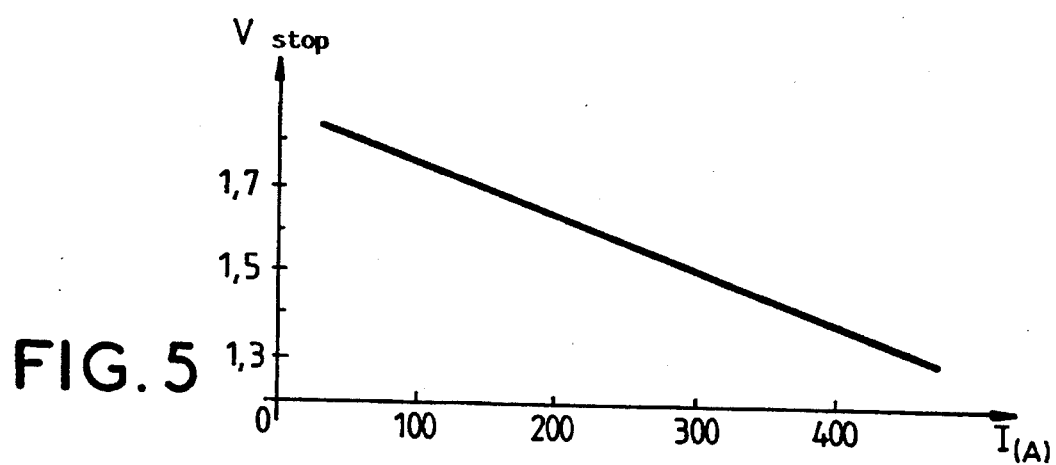

$2^{nd}$) $V_{stop}$=h (I) gives the change in the minimum voltage across the terminals of the battery as a function of the discharge currents. (See FIG. 5).

From these two curves is calculated the curve $$(Ch_{(t)} - C_{max(t)})/C_{max(t)} = K_1(T_{(t)}) \text{ pour } V_{(t)} = V_{arr\hat{e}t} = h(Ie)$$

where Ie is the discharge rate used to obtain the curves $V_{(t)} = g[(Ch_{(t)}, T_{(t)}]$. $C_{max(t)}$ is measured for a discharge at nominal temperature (for example 25° C.) and with a rate which is less than or equal to the nominal discharge rate for the type of battery considered (for example $I_5$). This discharge is preceded directly by optimal recharging allowing full charging of the battery. (For example for a lead battery a charge of the type IUi will be applied under optimal conditions (temperature=25° C.)). The charges Iui are, for lead batteries, charges during which the current injected into the battery and the voltage across the terminals of the battery are monitored over time for the purpose of maximizing the charge stored in a battery without destroying or impairing it.

C) Expression: $I_{(t)}*\Delta t$:

$I_{(t)}$ is measured in series with the battery with a sampling frequency which is compatible with the dynamics of consumption (for example on a vehicle, with the dynamics of driving).

D) Expression: $f2(Ch_{(t)}, T_{(t)}, I_{(t)})*\Delta t$: $f2(Ch_{(t)}, T_{(t)}, I_{(t)})$ is obtained by experimentally plotting the following sets of curves:

$1^{st}$) $V_{(t)} = g [Ch_{(t)}, I_{(t)}]$. The parameters are measured at $I_{(t)}$ constant over time and at nominal temperature (for example 25° C.) then at various temperatures which are constant over time and distributed over the range of operation of the battery (for example for a sealed lead traction battery −20° C. to +60° C.). (See also FIG. 4). $V_{(t)}$ is the voltage across the terminals of the battery, $T_{(t)}$ is the battery temperature measured for example on one of the output electrodes.

$2^{nd}$) $V_{stop}$=h(I) gives the change in the minimum voltage across the terminals of the battery as a function of the discharge currents.

a) From the curves g $[Ch_{(t)}, I_{(t)}]$ measured at nominal temperature and $h_{(I)}$, is calculated the curve:

$$[Ch_{(t)} - C_{max(t)}]/C_{max(t)} = K2(I_{(t)}) \text{ pour } V_{(t)} = V_{arr\hat{e}t} = h (Ie)$$

where Ie is the discharge rate used to obtain each curve of the set $V_{(t)} = g (Ch_{(t)}, I_{(t)})$.

$C_{max(t)}$ is measured for a discharge at nominal temperature (for example 25° C.) and with a rate which is less than or equal to the nominal discharge rate for the type of battery considered (for example $I_5$). This discharge is preceded directly by optimal recharging allowing full charging of the battery. (For example for a lead battery a charge of the type IUi will be applied under optimal conditions (temperature= 25° C.)).

b) From the curves g $(Ch_{(t)}, I_{(t)})$ measured at various temperatures and h(I), are calculated the various curves $[Ch_{(t)} - C_{max(t)}] - C_{max(t)} = K2 (I_{(t)})$ for $V_{(t)} = V_{stop} = h(Ie)$ where Ie is the discharge rate used to obtain each curve of the set $V_{(t)} = g (Ch_{(t)}, I_{(t)})$.

The change in the coefficients of K2 $(I_{(t)})$ is calculated as a function of the temperature variation. For example for a sealed lead traction battery we obtain:

$$K2(I_{(t)}, T_{(t)}) = +\mu 8[-e^{[-\mu 7(T_{(t)})*I(t)]}]$$

with $\mu 7(T_{(t)}) = -\Omega_1 * T_{(t)} + \Omega_2$ for $T_{(t)} \geq 25°$ C.

with $\mu 7)(T_{(t)}) = -\Omega_3 * T_{(t)} + \Omega_4$ for $T_{(t)} \leq 25°$ C.

E) Expression:

$$+f3 [-f2 (Ch_{(t-\Delta t)}, T_{(t-\Delta t)}, I_{(t-\Delta t)}] + Chre \; cov_{(t)}, T_{(t)}, I_{(t)})*\Delta t$$

and expression:

$$Chre \; cov_{(t)} = f3[-f2\{Ch_{(t-\Delta t)}, T_{(t-\Delta t)}, I_{(t-\Delta t)}\} + Chre \; cov_{(t-\Delta t)}, T_{(t)}, I_{(t)}]:$$

Figure 6:
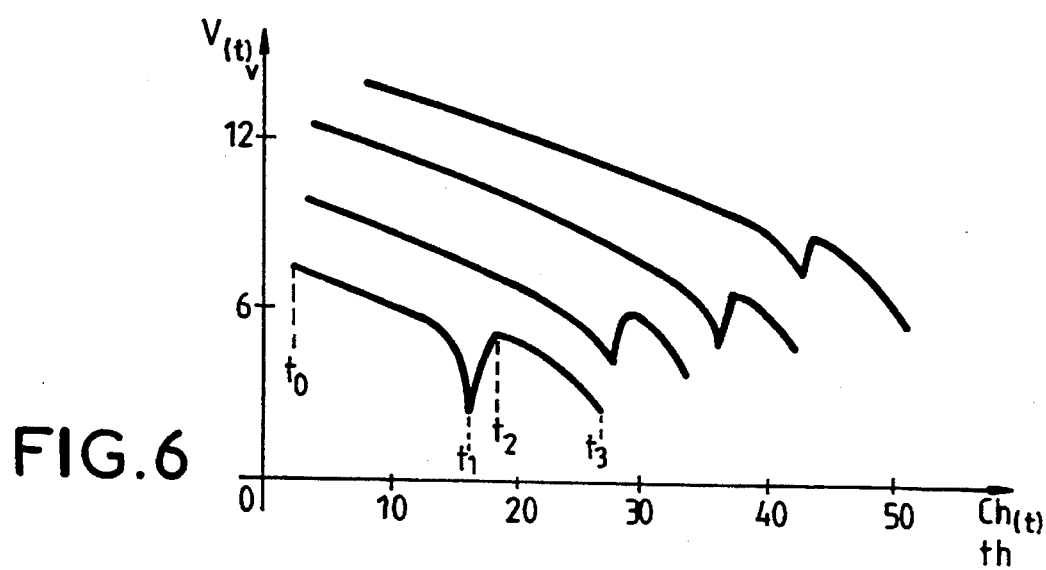

The part $f3[-f2\{Ch_{(t-\Delta t)}, T_{(t-\Delta t)}, I_{(t-\Delta t)}\} + Chre \; cov_{(t)}, T_{(t)}, I_{(t)})]$ is obtained by experimentally plotting the following sets of curves (see FIG. 6):

$1^{st}$) *$V_{(t)} = m(Ch_{(t)}, T_{(t)})$ with modification of $I_{(t)}$ over time:
from t=t0 to t=t1, discharge with current $I_1$
from t=t1 to t=t2, discharge with current $I_2$
from t=t2 to t3=end of discharge, discharge with current I constant over time and less than or equal to the nominal discharge current for the type of battery considered (for example $I_5$).

These curves are firstly plotted at nominal temperature while firstly varying the parameters t1 and t2 between t0 and the end of discharge, while fixing $I_1$ at the nominal discharge rate and $I_2$ at 0A.

New curves are plotted at nominal temperature by firstly varying the parameters t1 and t2 between t0 and the end of discharge, while fixing $I_1$ at various discharge rates and $I_2$ at 0 A.

New curves are plotted at nominal temperature by fixing t1 and t2 between t0 and the end of discharge (for example t1≈⅗ of the expected discharge time and t2≈⅘ of the expected discharge time), and by fixing $I_1$ at various discharge rates and $I_2$ at various discharge rates.

New curves are plotted at nominal temperature by fixing t1 and t2 between t0 and the end of discharge (for example t1≈⅗ of the expected discharge time and t2≈⅘ of the expected discharge time), and by fixing $I_1$ at various discharge rates and $I_2$ at 0.

$V_{(t)}$ is the voltage across the terminals of the battery, $T_{(t)}$ is the battery temperature measured for example on one of the output electrodes.

2nd) *$V_{stop}$=h(I) gives the change in the minimum voltage across the terminals of the battery as a function of the discharge currents.

a) From the curves m $[Ch_{(t)}, I_{(t)}]$ measured at nominal temperature and h(I), is calculated the curve Chre $cov_{(t)}$=K3 ($I_1, I_2, Ch_{(t)}$) by considering:

t=end of discharge time fixed at the instant at which $V_{(t)} = V_{stationary} = h$ (Ie) with Ie=discharge rate of the third sequence of the experiment conducted for each curve of the set $V_{(t)} = m[Ch_{(t)}, I_{(t)}]$.

$Ch_{(t)}$ is measured by accounting the quantities of electricity flowing across the terminals of the battery.

This discharge is preceded directly by optimal recharging allowing full charging of the battery. (For example for a lead battery a charge of the type IUi will be applied under optimal conditions (temperature=25° C.)).

b) From the curves m $[Ch_{(t)}, I_{(t)}]$ measured at various temperatures and h(I), is obtained Chre $cov_{(t)}$=K3 ($I_1, I_2, Ch_{(t)}$) by considering t=end of discharge time fixed at the instant at which $V_{(t)} = V_{stationary} = h(Ie)$ with Ie=discharge rate of the third sequence of the experiment conducted for each curve of the set $Ch_{(t)} = m [Ch_{(t)}, I_{(t)}]$.

The change in the coefficients of K3 $(I_1, I_2, Ch_{(t)}]$ is calculated as a function of the temperature variation (note:

as a first approximation the formula calculated above can be used for the expression D: f2 ($Ch_{(t)}$, $T_{(t)}$, $i_{(t)}$).

Mode of operation: charging when vehicle is stationary

Calculation of the charge stored in a battery during the phase of charging when stationary (that is to say with the help of a charger) is accomplished in two possible ways:

1) If charging is performed by an intelligent optimal charger capable of emitting an "end of charging and battery full" signal, then $Ch_{(t)}$ is fixed at the value of the maximum capacity of the battery at the instant t: $C_{max(t)}$. For example for a sealed lead traction battery, a microprocessor-controlled intelligent charger IUi is used, emitting the two signals, charger present and battery fully recharged.

2) In all other cases, the battery energy management processor adds up at each $\Delta t$ the quantity of current which arrives at the terminals of the battery and multiplies it by an efficiency factor depending on the quantity of electricity contained in the battery at the instant t, on the temperature and on the rate (intensity of charging). This gives a formula of the form:

$$Ch_{(t)}=Ch_{(t-\Delta t)}+I_{(t)}*\Delta t*f4(Ch_{(t)}, T_{(t)}, I_{(t)})$$

Figure 7:
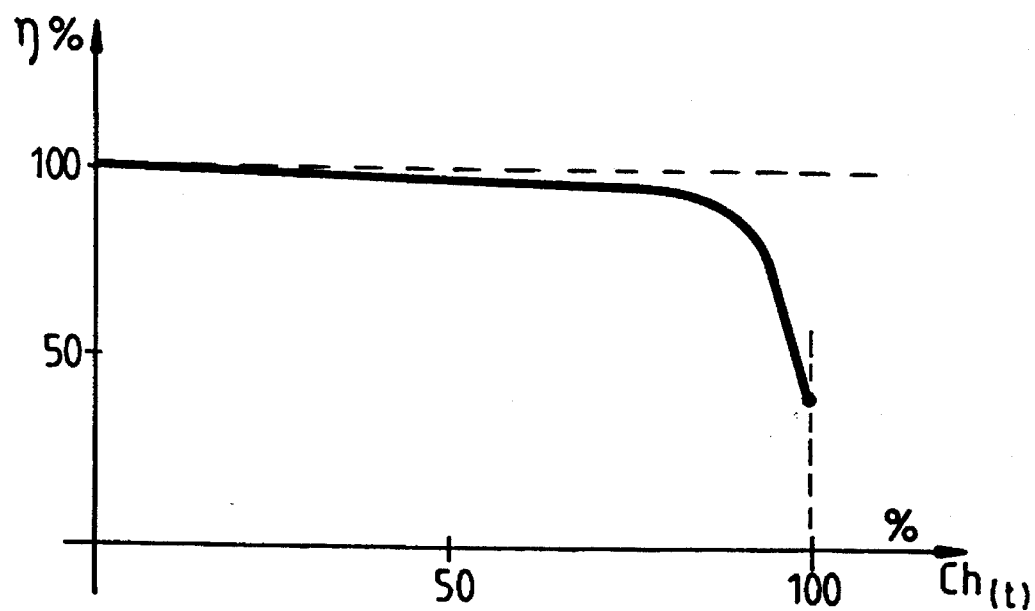

The expression: f4($Ch_{(t)}$, $T_{(t)}$, $I_{(t)}$) is determined experimentally by taking the following readings (see FIG. 7):

a) At nominal temperature, standard charging is performed up to $X1\%*C_{max(t)}$ then discharging under nominal conditions of temperature and of discharge current and the quantity of electricity gathered is measured. The experiment is repeated for various values of X1 and the function: charging efficiency=charge restored/charge stored is plotted.

b) The experiments are repeated for various temperatures, then for various charging intensities or profiles and the coefficients are defined which correct the function calculated or approximated during the experiments at nominal temperature.

Mode of operation: charge recovery by braking:

Calculation of the charge stored up in a battery during the charge recovery by braking phase, that is to say for example with the aid of an engine converted into a generator during vehicle braking) [sic] is accomplished as follows:

The battery energy management processor adds up at each increment $\Delta t$ the quantity of current which arrives at the terminals of the battery and multiplies it by an efficiency factor depending on the quantity of electricity contained in the battery at the instant t, on the temperature and on the rate (charge recovery intensity). This gives a formula of the form:

$$Ch_{(t)}=Ch_{(t-\Delta t)}+I_{(t)}*\Delta t*f5(Ch_{(t)}, T_{(t)}, I_{(t)})$$

Figure 8:
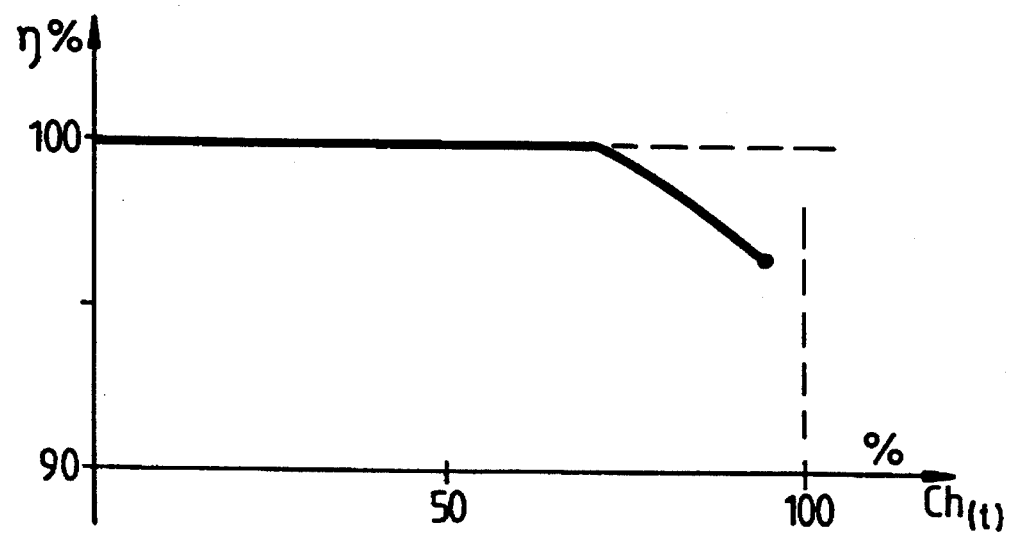

The expression f5($Ch_{(t)}$, $T_{(t)}$, $I_{(t)}$) is determined experimentally by taking the following readings (see FIG. 8):

a) At nominal temperature: on a battery charged to $X2\%*C_{max(t)}$, several partial chargings and then dischargings of value: $X0\%*C_{max(t)}$ are performed an odd number of times (charging n times followed by discharging then partial charging n+1) then discharging is carried out under nominal conditions of temperature and of discharge current and the quantity of electricity gathered is measured. The experiment is repeated for various values of X2 and the function: charging efficiency=charge restored/charge stored is plotted.

b) The experiments are repeated for various temperatures, then for various values of X3%, then various charging currents and the coefficients are defined which correct the function calculated or approximated during the experiments at nominal temperature.

Mode of operation: self-discharge during storage without use

Calculation of the charge lost from a battery during the recovery phase of storage without use is accomplished as follows:

At each end of storage (hence at the start of each of the preceding modes of operation when it is preceded by a phase in which the current delivered by the battery is zero) the battery energy management processor evaluates the quantity of current lost during storage as a function of the quantity of electricity contained in the battery at the instant t, the temperature and the duration of storage. This gives a formula of the form:

$$Ch_{(t)}=Ch_{(t-N\Delta t)}-f6(Ch_{t-N\Delta t}, T, N\Delta t)$$

The expression: f6($Ch_{(t-N\Delta t)}$, $T$, $N\Delta t$) is determined experimentally by taking the following readings:

a) At nominal temperature: on a battery charged to $X4\%*C_{max(t)}$, storage for $N1*\Delta t$ then discharge under the nominal conditions of temperature and of discharge current and measurement of the quantity of electricity gathered. The experiment is repeated for various values of N1 and the charge loss function is plotted.

b) The experiments are repeated for various temperatures, then for various values of X4% and the coefficients are defined which correct the function calculated or approximated during the experiments at nominal temperature.

We claim:

1. Process for evaluating the remaining charge in an accumulator battery, according to which the residual charge at the start of discharge is determined and the quantities of electricity extracted as and when the battery is used are added up, wherein account is taken of the quantities of charge which is not restorable instantaneously under the influence of the discharge rate and of the charge which is restorable by reducing the intensity of the current drawn from the battery.

2. Process according to claim 1, wherein when evaluating the remaining charge, account is also taken of the portion of charge which is not restorable under the influence of temperature.

3. Process according to claim 1, wherein the portion of charge which is not restorable under the influence of the discharge rate is a function, f2, of the form:

$$f2(Ch_{(t)}, T_{(T)}, I_{(t)})=[I_{(t)}*100/\{100-K2(T_{(t)}, I_{(t)}, Ch_{(t)})\}]-I_{(t)}$$

$Ch_{(t)}$ being the charge contained in the battery at each instant, $T_{(t)}$ being the battery temperature measured at each instant, $I_{(t)}$ being the intensity of the current delivered by the battery and measured at each instant, and K2 being a parameter representing the instantaneous efficiency of discharge.

4. Process according to claim 3, wherein the portion of the charge restored by relaxation of the battery is of the form:

$$Chre\ cov_{(t)}=f3[-f2(Ch_{(t-2\Delta t)}, T_{(t-2\Delta t)}, I_{(t-2\Delta t)}+Chre\ cov_{(t-\Delta t)}, T_{(t-\Delta t)}, I_{(t-\Delta t)}]$$

f3 being an exponential function of the recoverable energy in the battery at a given instant and $\Delta t$ a calculation step.

* * * * *